(12) United States Patent
O'Brien et al.

(10) Patent No.: US 8,265,573 B2
(45) Date of Patent: Sep. 11, 2012

(54) WIRELESS SUBSCRIBER COMMUNICATION UNIT AND METHOD OF POWER CONTROL WITH BACK-OFF THEREFORE

(75) Inventors: Michael O'Brien, Youghal (IE); Denis Dineen, Bollincolligl (IE); Patrick Pratt, Cork (IE)

(73) Assignee: Freescale Semiconductor, Inc., Austin, TX (US)

( * ) Notice: Subject to any disclaimer, the term of this patent is extended or adjusted under 35 U.S.C. 154(b) by 1117 days.

(21) Appl. No.: 12/096,550

(22) PCT Filed: Dec. 7, 2005

(86) PCT No.: PCT/EP2005/056593
§ 371 (c)(1),
(2), (4) Date: Jun. 6, 2008

(87) PCT Pub. No.: WO2007/065478
PCT Pub. Date: Jun. 14, 2007

(65) Prior Publication Data
US 2008/0299923 A1    Dec. 4, 2008

(51) Int. Cl.
*H01Q 11/12* (2006.01)
*H04B 1/04* (2006.01)

(52) U.S. Cl. .............. 455/127.1; 455/333; 455/550.1
(58) Field of Classification Search ............. 455/127.1, 455/127.2, 127.5, 550.1, 333
See application file for complete search history.

(56) References Cited

U.S. PATENT DOCUMENTS

| | | | |
|---|---|---|---|
| 6,535,066 B1 | 3/2003 | Petsko | |
| 6,553,212 B1 | 4/2003 | Wey | |
| 6,580,901 B1 | 6/2003 | Mochizuki | |
| 6,625,227 B1 | 9/2003 | Shull et al. | |
| 6,650,875 B1 * | 11/2003 | Rozenblit et al. | 455/91 |
| 6,693,488 B1 | 2/2004 | van Rhijn | |
| 6,920,334 B1 * | 7/2005 | Karsi et al. | 455/522 |
| 7,330,071 B1 * | 2/2008 | Dening et al. | 330/127 |
| 2002/0080890 A1 | 6/2002 | Kaczynski | |

FOREIGN PATENT DOCUMENTS

| | | |
|---|---|---|
| EP | 1463197 B1 | 10/2006 |
| JP | 06244652 | 9/1994 |

* cited by examiner

*Primary Examiner* — Nhan Le

(57) ABSTRACT

A wireless subscriber communication unit comprises a transmitter having a power amplifier and a feedback power control loop having a power control function arranged to set an output power level of the power amplifier. The power control function is arranged to perform a back-off of the output power prior to completion of a transmission burst.

20 Claims, 4 Drawing Sheets

WIRELESS SUBSCRIBER COMMUNICATION UNIT AND METHOD OF POWER CONTROL WITH BACK-OFF THEREFORE

FIELD OF THE INVENTION

This invention relates to power control in a wireless subscriber communication unit. The invention is applicable to, but not limited to, improving the performance of wireless power amplifier control during a ramp-down operation.

BACKGROUND OF THE INVENTION

Wireless communication systems, for example cellular telephony or private mobile radio communication systems, typically provide for radio telecommunication links to be arranged between a plurality of base transceiver stations (BTS) and a plurality of subscriber units. An established harmonised cellular radio communication system, providing predominantly speech and short-data communication, is the Global System for Mobile Communications (GSM). GSM is often referred to as $2^{nd}$ generation cellular technology.

An enhancement to this cellular technology, termed the General Packet Radio System (GPRS), has been developed. GPRS provides packet switched technology on GSM's switched-circuit cellular platform. A yet further enhancement to GSM that has been developed to improve system capacity can be found in the recently standardised Enhanced Data Rate for Global Evolution (EDGE) that encompasses Enhanced GPRS (EGPRS). A still yet further harmonised wireless communication system currently being defined is the universal mobile telecommunication system (UMTS). UMTS is intended to provide a harmonised standard under which cellular radio communication networks and systems will provide enhanced levels of interfacing and compatibility with many other types of communication systems and networks, including fixed communication systems such as the Internet. Due to this increased complexity, as well as the features and services that it supports, UMTS is often referred to as a third generation (3G) cellular communication technology. In UMTS subscriber units are often referred to as user equipment (UE).

In such cellular wireless communication systems, each BTS has associated with it a particular geographical coverage area (or cell). The coverage area is defined by a particular range over which the BTS can maintain acceptable communications with subscriber units operating within its serving cell. Often these cells combine to produce an extensive coverage area.

Wireless communication systems are distinguished over fixed communication systems, such as the public switched telephone network (PSTN), principally in that mobile stations/subscriber equipment move between coverage areas served by different BTS (and/or different service providers). In doing so the mobile stations/subscriber equipment encounter varying radio propagation environments. In particular, in a mobile communication context, a received signal level can vary rapidly due to multipath and fading effects.

One feature associated with most present day wireless communication systems allows the transceivers in either or both the base station and/or subscriber unit to adjust their transmission output power to take into account the geographical distance between them. The closer the subscriber unit is to the BTS's transceiver, the less power the subscriber unit and the BTS's transceiver are required to transmit, for the transmitted signal to be adequately received and decoded by the other unit. Thus, the transmit power is typically controlled, i.e. set to a level that enables the received signal to be adequately decoded, yet reduced to minimize potential radio frequency (RF) interference. This 'power control' feature saves battery power in the subscriber unit. Initial power settings for the subscriber unit, along with other control information, are set by the information provided on a beacon (control) physical channel for a particular cell.

Furthermore, in a number of wireless communication systems, the effect of fast fading in the communication channel is a known and generally undesirable phenomenon caused by the signal arriving at a receiver via a number of different paths. Therefore, fast power control loops are often adopted to rapidly determine and optimize the respective transmit power level. Such power control loops introduce potential instability problems into the transmitter design.

The inventors of the present invention have identified that in the field of power control techniques, and particularly at the higher power amplifier output power levels, for example >30 dBm, the closed loop system sometimes does not operate over sufficient bandwidth to track the reference signal rapidly enough, which is as a direct result of the control slope of the PA collapsing.

In the context of the present invention, the expression 'bandwidth', with respect to closed loop power control operation of the transmitter, encompasses a speed at which a system responds to an input perturbation.

Once the power amplifier has reacted, the reference signal has already ramped down significantly. In this case, the power amplifier output power must then drop very dramatically to compensate for the fact that the reference signal has already dropped. Invariably, in such a situation, a switching transient hit is incurred, which causes spectral degradation of the transmit signal.

As a result of these effects, critical standards' specifications are failed, such as:
  (i) Power versus time (PvT) mask, or
  (ii) Out-of-band spectral emission performance.

For power amplifiers operating in a closed loop environment, a poor control slope (between the bias input and the detector output) significantly shortens the bandwidth of the system. This is particularly the case at higher output power levels and provides a sluggish performance of the power control operation. Typically, it is intended that the radio frequency (RF) power output signal tracks a raised cosine profile response on a 'ramp-down' operation.

However, due to the aforementioned sluggish behaviour (hereinafter referred to as a 'dead-zone', as illustrated in FIG. 1), of the power amplifier, particularly when operating in a 'closed-loop' architecture, it takes a finite time (in the order of µsec) for the output to react to the ramp-down operation. This degrades the transient behaviour at the output of the power amplifier, which, in turn, degrades the switching transient performance of the transmitter. As a result, unfavourable interference at adjacent channels occurs that fail to meet, say, the 3GPP/ETSI 05.05 specifications.

U.S. Pat. No. 6,625,227 B1, titled "Artificial ramping of transmit power for burst transmissions" describes a mechanism for looking at the symbols used in a transmission and then initiates both ramp-up and ramp-down operations based on these symbols. In particular, the mechanism proposes modifying ramp profiles to specifically improve phase transitions.

U.S. Pat. No. 6,553,212 B1, titled "Method and apparatus for improving loop stability and speed of a power control loop", describes a mechanism for assessing a system power and determines how fast/slow the system is at that given power. The document then proposes modifying the gain within the feedback path, which effectively modifies the closed loop bandwidth.

A need therefore exists, in general, for an improved power control arrangement and method of operation, particularly in the case of a power amplifier performance operating in a closed-loop architecture at relatively high power output levels.

SUMMARY OF THE INVENTION

In accordance with the present invention, there is provided a wireless communication unit comprising a power control system, a method for controlling an output power level of a subscriber communication unit and an integrated circuit therefore, as defined in the appended claims.

BRIEF DESCRIPTION OF THE DRAWINGS

Exemplary embodiments of the present invention will now be described, with reference to the accompanying drawings, in which.

DESCRIPTION OF EMBODIMENTS OF THE INVENTION

In embodiments of the present invention, a process is adopted whereby the power amplifier (PA) is brought out of its 'dead-zone' before the ramp-down signal is applied. In this manner, the power amplifier performance is modified so that it is capable of reacting rapidly before the ramp-down process begins. Thus, the ramp-down process is made more smooth, for example, at the higher output powers, as the power amplifier has already come out of its 'deadzone'. Advantageously, the process improves the transient behaviour of the wireless subscriber communication unit when the power amplifier (PA) is ramping down from high output power levels, as well as providing an improved switching transient performance.

Figure 1:
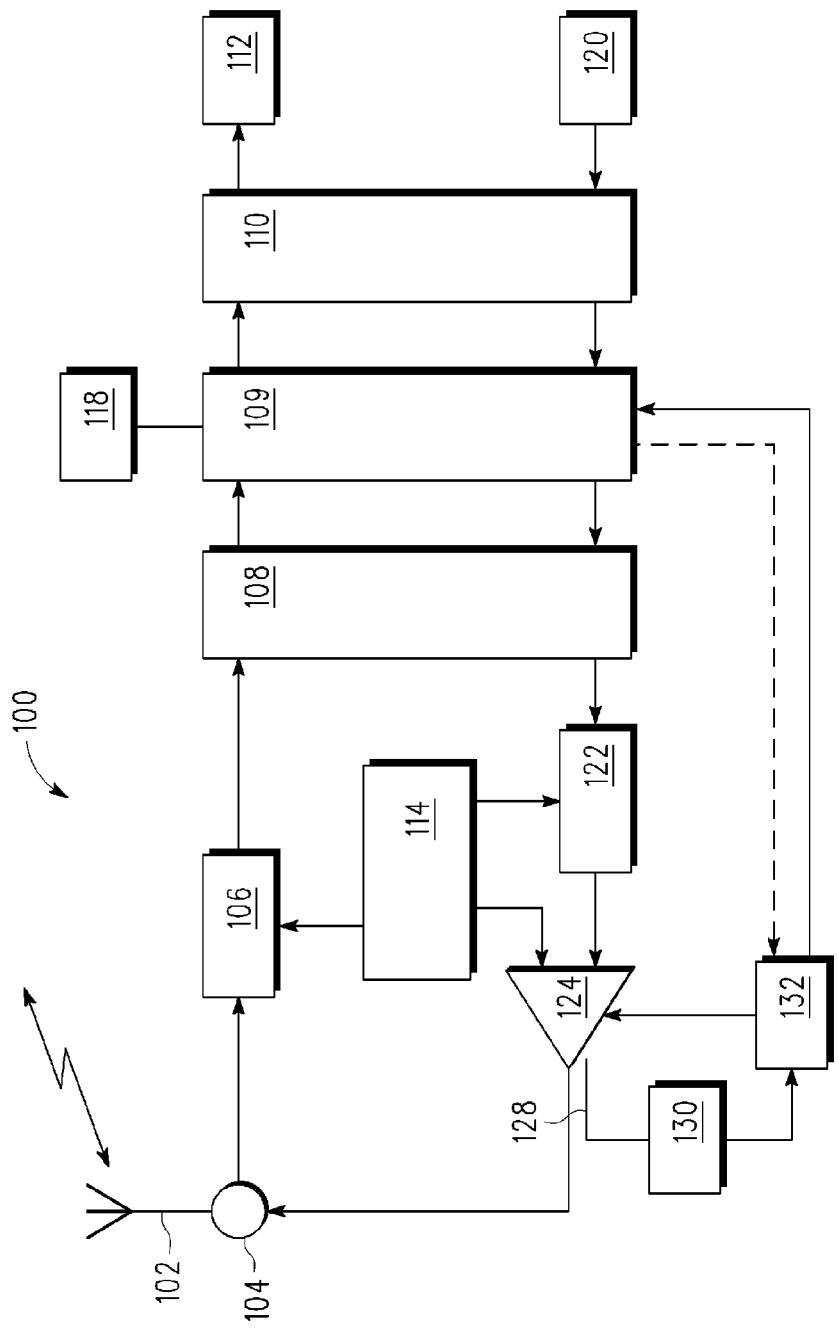
FIG. 1 illustrates a functional block diagram of a wireless subscriber unit, adapted in accordance with one embodiment of the present invention.

Referring now to FIG. 1, a block diagram of a subscriber unit, sometimes referred to as mobile station (MS) or user equipment (UE) 100, is illustrated. The subscriber unit is adapted to support the inventive concept of embodiments of the present invention. The subscriber unit 100 comprises an antenna 102 coupled to a duplex filter or antenna switch 104 that provides isolation between receive and transmit chains within subscriber unit 100.

For completeness, the whole architecture of the subscriber unit 100 will be described, albeit that the inventive concept relates to the power amplifier and power control operation of the transmitter chain. The subscriber unit 100 comprises a receiver chain that includes receiver front-end circuit 106 (effectively providing reception, filtering and intermediate or base-band frequency conversion). The receiver front-end circuit 106 receives signal transmissions from another wireless communication unit, for example its associated Base station. The receiver front-end circuit 106 is serially coupled to a signal processing function (generally realised by a digital signal processor (DSP)) 108. The signal processing function 108 performs de-interleaving, signal demodulation, error correction, data formatting, etc. of the received signal. Recovered information from the signal processing function 108 is serially coupled to a power control processing function 109, which extracts pertinent power control information from the received and decoded beacon signal and interprets the information to determine an appropriate transmit output level for the subscriber unit's transmissions.

As known in the art, received signals that have been processed by the power control processing function 109 are typically input to a baseband-processing function 110. The baseband processing device 110 takes the received information formatted in a suitable manner and sends it to an output device 112, such as an audio speaker or liquid crystal display or visual display unit (VDU). A controller 114 controls the information flow and operational state of each circuit/element/function.

In different embodiments of the invention, the signal processing function 108, power control processing function 109 and baseband processing function 110 may be provided within the same physical signal-processing device.

A timer 118 is operably coupled to the signal processing functions to provide synchronisation in both the signal recovery and signal generation processes.

As regards the transmit chain, this essentially includes an input device 120, such as a microphone or keypad, coupled in series through baseband processor 110, a power control processing function 109, signal processing function 108, transmitter/modulation circuitry 122 and a power amplifier 124. The signal processing function 108, transmitter/modulation circuitry 122 and the power amplifier 124 are operationally responsive to the controller 114, with an output from the power amplifier 124 coupled to the duplex filter or antenna switch 104, as known in the art.

The transmit chain in subscriber unit 100 takes the baseband signal from input device 120 and converts this into a signal whose level can be baseband adjusted by the power control processor 109. The power control processor forwards the amplitude-adjusted signal to the signal processor 108, where it is encoded for transmission by transmit/modulation circuitry 122, thereafter amplified by power amplifier 124, and radiated from antenna 102. Clearly, the adjustment of the transmit output power can be effected by any amplitude or attenuation means in the transmit chain, and the above baseband adjustment is described as one example only.

Notably, in accordance with one embodiment of the present invention, a sample of the transmitted signal is fed back to a power control function 132. A typical feedback mechanism that can be applied to the above transmitter architecture comprises a coupler 128 and a log detector 130. The power control function 132 is also responsive to the power control processor function 109.

The power control processor function 109 monitors the output power of the power amplifier by running a saturation detection algorithm in order to determine whether the power amplifier is saturating. When the power amplifier is determined as saturating, for example where its performance is becoming non-linear due to a too-high input power, or due to a varying load, battery supply or temperature, a saturation signal is set high by the power amplifier control function 132. When the power control processor function 109 determines that the saturation signal is set high, it recognises that a poor transient behaviour may exist during a ramp-down operation of the power amplifier 124.

In one embodiment of the present invention, a digital control signal is used to trigger a transmit burst, after which the digital control signal can initiate a ramp-up operation. Similarly, the digital control signal may indicate that transmission on the slot has finished as well as subsequently initiate a ramp-down operation. In one embodiment of the present invention, in response to determining that the saturation signal is set 'high', an improved back-off algorithm is run by the power control processor function 109. In this regard, the power control processor function 109 toggles one or more bit(s) within the digital signal prior to the normal toggling of one or more bit(s) or bit sequence that initiate a ramp-down operation.

Furthermore, if the power control processor function 109 initiates the back-off algorithm, then a finite time before ramp-down occurs, a slight negative perturbation is placed on the target output power. Based on a series of simulations, the inventors have found that a back-off power instigated around 3 μsec. from the start of the ramp-down operation provides a good performance in a GSM subscriber unit. However, it is envisaged that in other architectures, or when using other functional elements or devices, alternative back-off time periods may be appropriate. For example, a suitable time period for GSM ramp-down operation may be within a specified time range of 1 μsec. to 8 μsec.

In particular, the use of a slight negative perturbation excites the analog control loop, which in effect brings the power amplifier output performance out of its dead-zone a sufficient time before the ramp-down operation occurs. The ramp-down signal is, thus, applied as normal and completed within an appropriate time period after the start of ramp-down operation. As the analog loop has now already overcome its 'dead-zone', the output power tracks the reference ramp smoothly.

In one embodiment of the present invention, the power control processor function 109 employs two variable and dynamically adjustable parameters used in the improved power control operation.

A first parameter is a selection of a suitable time (before ramp-down is initiated) that the power amplifier power is backed off, i.e. a relative timing when the one or more power control bit(s) is/are toggled. Advantageously, this value can be modified in software.

A second parameter that can be dynamically adjusted is the back-off value, to maintain a suitable output power level during the end of the data transmission burst, whilst meeting the specification requirements. In one embodiment of the present invention, this value is register-controlled and can be fixed or dynamically adjusted. The back-off value can be implemented using any known means, such as adjustment of the input signal say via control of an amplification or attenuation function. Alternatively, it is envisaged that adjustment may be made of the dc power level applied to an amplifier, to reduce the performance of the amplifier and therefore reduce the gain applied to the input signal. Notably, in one embodiment, the back-off mechanism is applied outside of the control loop, thereby avoiding consideration of subsequent loop stability issues.

The output power back-off needs to be carefully controlled, as adjusting the power back-off level by too much may, for example, cause either:
(i) Power versus time (PvT) to be compromised; or
(ii) A large step in the back-off power causes a similar step in the output power. This could induce poor transients in the power amplifier, which inadvertently compromises switching transient performance.

Furthermore, in one embodiment of the present invention, the majority of the power control functions may be implemented in a digital signal processor (DSP). However, it is within the contemplation of the invention that the power control processor circuitry described in the above embodiments can be embodied in any suitable the above embodiments can be embodied in any suitable form of software, firmware and/or hardware.

Figure 2:
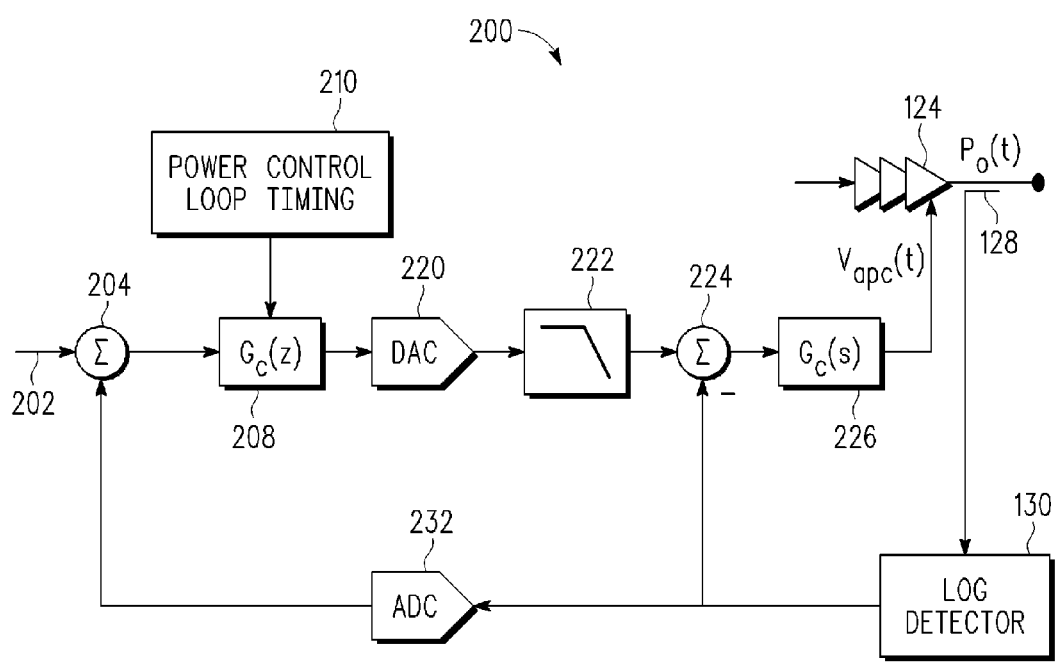
FIG. 2 illustrates a functional block diagram of a power control sub-system capable of being used in the embodiments of the present invention.

Referring now to FIG. 2, a functional block diagram of a the power amplifier sub-system 200 of a subscriber unit, adapted to incorporate the present invention, is shown in more detail. The feedback loop comprises, for example, a log-detector function 130 that allows the feedback loop to be closed at low (<−5 dBm) power levels. Notably, the control system incorporates an outer loop, comprising log detector 130, analog-to-digital converter 232 and summing junction 204.

A skilled artisan will appreciate that the above circuit configuration is one example of a circuit that can employ the inventive concept described herein, although it is envisaged that other circuit configurations may also benefit from the inventive concept hereindescribed.

The requirements for the analog controller 208 can be stated as follows:
(i) It must provide a sufficiently high gain to maintain the bandwidth during ramp-down from high power settings, and
(ii) It must provide sufficient gain-phase margin that ramping-up is not problematic.

A classical two-term PI controller 208 can adequately meet this requirement. This has the general form of:

$$G(z) = \frac{k_i}{s} + k_p = \frac{k_p(s + k_i/k_p)}{s}$$

The integral gain term is chosen primarily to ensure adequate loop gain for the ramp-down condition. The proportional gain term is then selected to introduce a zero at a specific location, so as to maintain the gain-phase margin.

In one embodiment of the present invention, the value by which the power level is backed off depends on the output power level that is being targeted. In this embodiment, it is envisaged that this back-off may be limited to higher output powers only, for example >30 dBm. A determination of the output power is made using the signal coupled from the coupler 128 at the output of the power amplifier, and detected by log detector 130.

In one embodiment, the use of a slight negative perturbation applied to input signal 202 brings the power amplifier output performance out of its dead-zone. The perturbation is applied a sufficient time before the ramp-down operation occurs.

The inventors of the present invention have identified that the power amplifier responds more slowly at the higher target power levels, and with an acceptable speed at lower power levels. As such, it is envisaged that a determination is made as to the target output power, and the improved back-off algorithm initiated in response to whether the target output power exceeds a threshold power level, such as 30 dBm. In particular, simulations and empirical evidence have shown that the output power level may be backed off by any value from 0.1 dB to 0.5 dB to provide a reasonable performance that meets the power versus time (PvT) mask.

Figure 3:
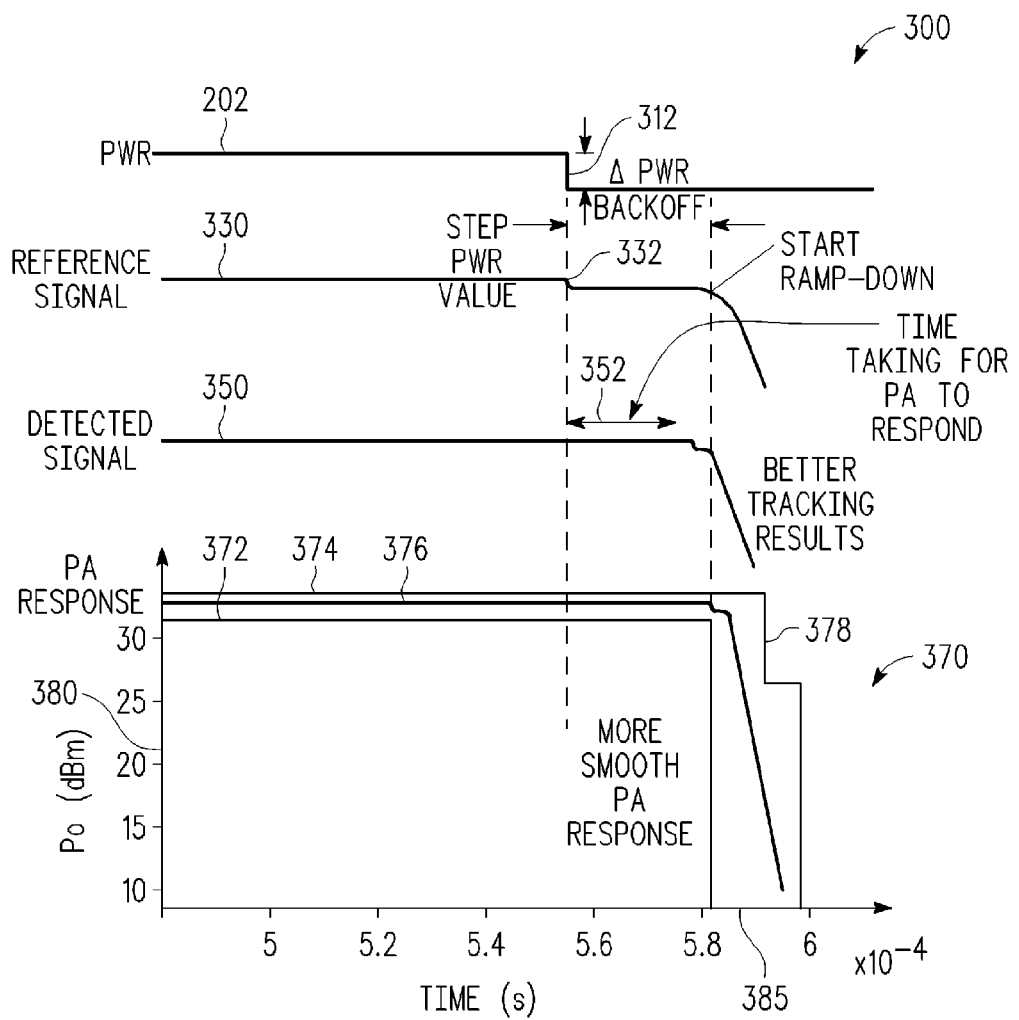
FIG. 3 shows a series of waveforms utilised in one embodiment of the present invention.

Referring now to FIG. 3, a series of waveforms utilising the inventive concept of the present invention are illustrated. A first waveform indicates the power control level to be applied to the power amplifier 202. Notably, in accordance with one embodiment of the present invention, the digital code representing the power target is backed-off by a suitable margin 312 (by applying a negative perturbation) at a time prior to the end of the active transmission of data from the wireless subscriber communication unit. In effect, when the detected signal 350 is the same as the reference signal 330 then the power output from the power amplifier 128 (in FIG. 1) represents the desired target power.

A second reference signal 330, for example the signal input to the power amplifier, is also illustrated. Notably, in accordance with one embodiment of the present invention, a small perturbation 332 to the power level is applied to the reference signal due to the back-off power applied. This perturbation occurs a suitable time margin prior to the initiation of the power amplifier ramp-down operation of the wireless subscriber communication unit.

Advantageously, the third detected signal waveform 350, shows a small perturbation to the detected output power level at this suitable time margin 352 prior to the initiation of the power amplifier ramp-down operation of the wireless subscriber communication unit. This perturbation pulls the power amplifier system outside of its 'dead-zone' a sufficient time before ramp-down is initiated and thus provides ample time to remove the loop from its 'dead-zone'. When ramp-down is initiated then the power amplifier system is in a healthy bandwidth region.

This operation is in contrast to the problems encountered with prior art power amplifiers, particularly those operating at relatively high output levels in a closed-loop architecture, where the output power response continues for an extended period of time due to its 'deadzone'. This extended period of time risks encroaching on the outer limit 378 of the PvT mask.

Graph 370 illustrates the output power response 376 of the power amplifier for output power 380 versus time 385. Thus, as shown in graph 370, the output power response 376 of the power amplifier lies within the upper threshold 374 and lower threshold 372 power settings, and also starts to fall off, in response to the ramp-down operation at the correct time.

Figure 4:
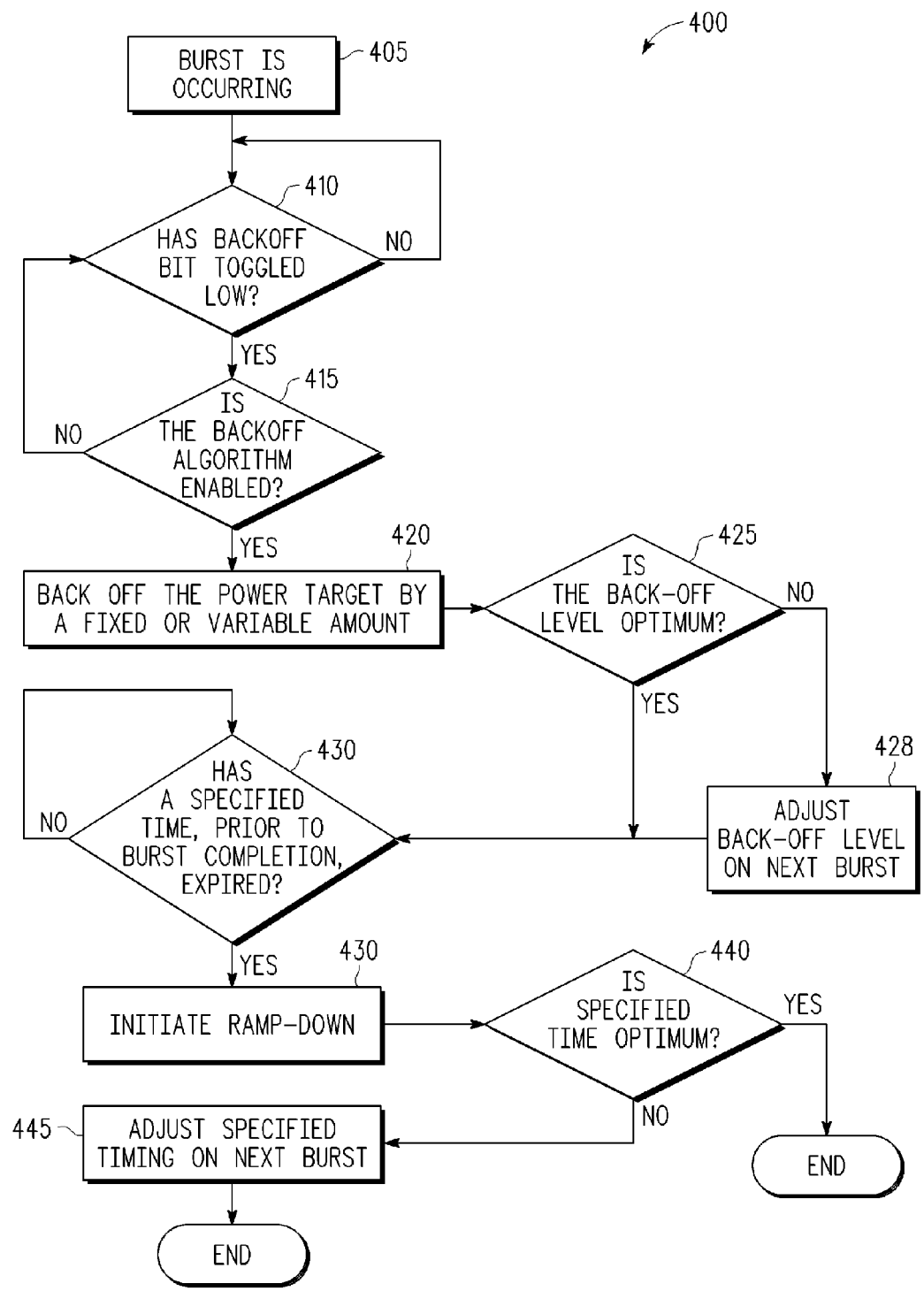
FIG. 4 shows a flowchart of an improved power control algorithm in accordance with one embodiment of the present invention.

FIG. 4 shows a flowchart 400 of an improved power control algorithm in accordance with one embodiment of the present invention. The improved power control process is initiated once a transmission burst of data has commenced, as shown in step 405. A determination is then made as to whether a power amplifier output condition exists, where running the back-off algorithm according to the present invention will enable the transmitter to operate within the required specification. In this regard, if the power control processing function of the wireless subscriber communication unit has determined that the back-off algorithm should be run, one or more back-off bit(s) of the control sequence is toggled, in step 410.

A check is then made as to whether the back-off algorithm is enabled, as shown in step 415. If the back-off algorithm is not enabled in step 415, a further determination is then made as to whether the one or more back-off bit(s) is/are toggled in step 410. If the back-off algorithm is enabled in step 415, the power control level is backed-off by a fixed or variable amount, as shown in step 420 and as previously described with reference to FIGS. 1-3. A determination is then made as to whether the selected back-off level is optimum, as in step 425.

If the selected back-off level is not optimum, in step 425, the power control level is backed-off by a further fixed or variable amount, as shown in step 420. A further determination is then made as to whether the modified back-off level is optimum for this burst, in step 425. If the back-off level is not optimum, it is adjusted on the next burst, as shown in step 428. Thus, in this embodiment, the back-off level may be modified on a per-burst basis, where the first fixed back-off level is a roughly accurate, and subsequent modification of the power control level fine tunes the back-off level. In an alternative embodiment, a fixed back-off level is used.

Following a determination as to whether the selected back-off level is optimum, in step 425, a determination is made as to whether a specified time, prior to the completion of the burst expiring, as shown in step 430. If the specified time has not expired, in step 430, the process loops until it has. Once the specified time has expired, in step 430, the power control processing function initiates a ramp-down operation, as shown in step 435.

In one embodiment, a determination is then made as to whether the specified time is optimum with respect to the PvT mask, as shown in step 440. If the specified time is optimum in step 440 the back-off algorithm is completed for this burst. If the specified time is not optimum in step 440, the specified time is adjusted on the next burst, as shown in step 445.

Thus, in this manner, the ramp-down process is improved by performing a back-off of the power control signal a specified time prior to completion of the burst. In performing a back-off operation in this manner, the power-time specification can be met, irrespective of the output power level. Furthermore, the back-off level and/or the specified time may be modified to fine-tune the process.

It will be appreciated by a skilled artisan that the inventive concepts are not limited to a 3G or 2.xG wireless communication device, nor to a closed-loop transmitter architecture, but are applicable to any wireless communication unit.

It is envisaged that the aforementioned inventive concepts may also be applied to a large number transceiver architectures and platform solutions. For example, a semiconductor manufacturer may employ the inventive concepts in a design of a stand-alone RFIC and/or application specific integrated circuit (ASIC) and/or any other sub-system element.

It will be understood that the method and arrangement for closed-loop power control described above provides at least one or more of the following advantages, but may also provide further advantages not so listed:

(i) A power amplifier operating with a constant envelope modulation scheme can be run very close to its compression level, i.e. most efficient operating point, without the known drawbacks of transient switching effects or power versus time profiles found in many air-interface protocol specifications, such as the Global System for Mobile (GSM) communications standard;

(ii) Closed loop PA bandwidth constraints are accounted for within the power control function;

(iii) The power control system is flexible and able to meet the transient requirements of the system to meet the 3GPP/ETSI 05.05 specification; and (iv) In attempting to optimise the ramp-down process, the power control back-off level and/or the specified time, before completion of the burst transmission, may be varied.

The advantages described are merely exemplary. The aforementioned and other advantages may be realized by the embodiments described herein, and not all advantages need be achieved by all embodiments of the invention.

It will be appreciated that any suitable distribution of functionality between different functional units or signal processing elements, such as a power control signal processing function, may be used without detracting from the inventive concept herein described.

Hence, references to specific functional devices or elements are only to be seen as references to suitable means for providing the described functionality, rather than indicative of a strict logical or physical structure or organization.

Aspects of the invention may be implemented in any suitable form including hardware, software, firmware or any combination of these. The elements and components of an embodiment of the invention may be physically, functionally and logically implemented in any suitable way. Indeed, the functionality may be implemented in a single unit or IC, in a plurality of units or ICs or as part of other functional units.

In particular, it is envisaged that the aforementioned inventive concept can be applied by a semiconductor manufacturer to any user interface. It is further envisaged that, for example, a semiconductor manufacturer may employ the inventive concept in a design of a stand-alone user interface for a computing device or application-specific integrated circuit (ASIC) and/or any other sub-system element.

Although the present invention has been described in connection with some embodiments, it is not intended to be limited to the specific form set forth herein. Rather, the scope of the present invention is limited only by the accompanying claims. Additionally, although a feature may appear to be described in connection with particular embodiments, one skilled in the art would recognize that various features of the described embodiments may be combined in accordance with the invention. In the claims, the term 'comprising' does not exclude the presence of other elements or steps.

Furthermore, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather indicates that the feature is equally applicable to other claim categories, as appropriate.

Furthermore, the order of features in the claims does not imply any specific order in which the features must be performed and in particular the order of individual steps in a method claim does not imply that the steps must be performed in this order. Rather, the steps may be performed in any suitable order. In addition, singular references do not exclude a plurality. Thus, references to "a", "an", "first", "second" etc. do not preclude a plurality.

Thus, a wireless communication having a power control system has been described wherein the aforementioned disadvantages associated with prior art arrangements have been substantially alleviated.

The invention claimed is:

1. A wireless subscriber communication unit comprises a transmitter comprising:
   a power amplifier; and
   a closed loop analog feedback power control loop having a power control function arranged to set an output power level of the power amplifier,
   wherein the power control function performs a back-off of the output power level, in response to a back-off of a power level provided to the power amplifier, prior to completion of a transmission burst.

2. The wireless subscriber communication unit according to claim 1 wherein the back-off of the output power level is initiated by the power control function a specified time before initiating a ramp-down process.

3. The wireless communication unit according to claim 2, wherein the power control function varies the specified time on a per burst basis.

4. The wireless subscriber communication unit according to claim 3 wherein the specified time ranges between 1 μsec and 8 μsec.

5. The wireless subscriber communication unit according to claim 2 wherein the power control function performs the back-off of the output power level prior to completion of the transmission burst for a subset of a range of output power levels.

6. The wireless communication unit according to claim 2, wherein the power control function performs the back-off of the output power level varied on a per burst basis.

7. The wireless subscriber communication unit according to claim 2 wherein the back-off of the output power level ranges between 0.1 dB and 0.5 dB.

8. The wireless subscriber communication unit according to claim 1 wherein the power control function performs the back-off of the output power level prior to completion of a transmission burst for a subset of a range of output power levels.

9. The wireless communication unit according to claim 1, wherein the power control function performs the back-off of the output power level varied on a per burst basis.

10. The wireless subscriber communication unit according to claim 9 wherein the back-off of the output power level ranges between 0.1 dB and 0.5 dB.

11. The wireless communication unit according to claim 1, wherein the power control function is operably coupled to a power control processor function and arranged to toggle one or more bit(s) within a digital signal prior to initiating the back-off of the output power level.

12. A method of power control in a wireless subscriber communication unit comprising a transmitter having a closed loop analog feedback power control loop having a power control function, the method comprising the steps of:
    setting an output power level of the transmitter by the power control function;
    transmitting a data burst; and
    performing a back-off of the output power level, in response to performing a back-off of a power level provided to a power amplifier, prior to completion of a transmission burst by the power control function.

13. The method according to claim 12 wherein the step of performing a back-off of the output power level comprises performing the back-off a specified time before initiating a ramp-down process.

14. The method according to claim 13, wherein the step of performing the back-off of the output power level further comprises varying the specified time on a per burst basis.

15. The method according to claim 13 wherein the step of performing the back-off of the output power level comprises performing the back-off of the output power level prior to completion of the transmission burst for a subset range of an output power level range.

16. The method according to claim 13, wherein the step of performing the back-off of the output power level further comprises varying the back-off level of the output power level on a per burst basis.

17. The method according to claim 12 wherein the step of performing the back-off of the output power level comprises performing the back-off of the output power level prior to completion of the transmission burst for a subset range of an output power level range.

18. The method according to claim 12, wherein the step of performing the back-off of the output power level further comprises varying the back-off level of the output power level on a per burst basis.

19. The method according to claim 12, wherein the step of performing the back-off of the output power level comprises toggling one or more bit(s) within a digital signal prior to performing the back-off of the output power level.

20. An integrated circuit for use in a wireless communication device comprising:
- a transmitter;
- a closed loop analog feedback power control loop having a power amplifier; and
- a power control function arranged to set an output power level of the transmitter, wherein the power control function performs a back-off of the output power level, in response to a back-off of a power level provided to the power amplifier, prior to completion of a transmission burst.

* * * * *

UNITED STATES PATENT AND TRADEMARK OFFICE
CERTIFICATE OF CORRECTION

PATENT NO.        : 8,265,573 B2
APPLICATION NO.   : 12/096550
DATED             : September 11, 2012
INVENTOR(S)       : Michael O'Brien et al.

Page 1 of 1

It is certified that error appears in the above-identified patent and that said Letters Patent is hereby corrected as shown below:

At column 10, line 44, please change "performing a back-off" to be --performing the back-off--

Signed and Sealed this
Fifth Day of February, 2013

Teresa Stanek Rea
*Acting Director of the United States Patent and Trademark Office*